United States Patent [19]

Zarudiansky

[11] 4,315,417
[45] Feb. 16, 1982

[54] BOREHOLE LOGGING TOOL CRYOSTAT

[75] Inventor: Alain Zarudiansky, Velizy, France

[73] Assignee: Schlumberger Technology Corporation, Houston, Tex.

[21] Appl. No.: 161,069

[22] Filed: Jun. 19, 1980

[30] Foreign Application Priority Data

Jun. 21, 1979 [GB] United Kingdom ............... 21750/79

[51] Int. Cl.³ ............................................. F25B 19/00
[52] U.S. Cl. .................................. 62/514 R; 250/261
[58] Field of Search .................... 62/260, 259, 514 R, 62/514 JT; 165/45; 250/261

[56] References Cited

U.S. PATENT DOCUMENTS

| | | | |
|---|---|---|---|
| 2,711,084 | 1/1955 | Bergan | 62/92 |
| 2,727,119 | 12/1955 | Thomson | 250/261 |
| 2,760,078 | 8/1956 | Youmans | 250/261 |
| 2,824,233 | 2/1958 | Herzog | 250/261 |
| 2,862,106 | 11/1958 | Scherbatskoy | 62/514 R |
| 2,949,534 | 8/1960 | Youmans | 250/261 |
| 3,016,961 | 1/1962 | McKay et al. | 250/261 |
| 3,038,074 | 6/1962 | Scherbatskoy | 250/261 |
| 3,049,620 | 8/1962 | George et al. | 250/261 |
| 3,055,192 | 9/1962 | Dennis | 62/514 JT |
| 3,080,478 | 3/1963 | Scherbatskoy | 250/261 |
| 3,105,148 | 9/1963 | Monaghan et al. | 250/261 |
| 3,167,653 | 1/1965 | Rumblec | 250/261 |
| 3,176,473 | 4/1965 | Andonian | 62/45 |
| 3,265,893 | 8/1966 | Rabson et al. | 250/261 |
| 3,369,370 | 2/1968 | Todd et al. | 62/45 |
| 3,379,032 | 4/1968 | Wilson | 62/259 |
| 3,435,629 | 4/1969 | Hallenburg | 62/259 |
| 3,496,360 | 2/1970 | Dewan | 62/514 R |
| 3,609,992 | 10/1971 | Cacheux | 62/514 R |
| 3,633,030 | 1/1972 | Antkiw | 250/261 |
| 3,693,374 | 9/1972 | Juvonen et al. | 62/514 R |
| 3,702,932 | 11/1972 | Tanner et al. | 62/514 R |
| 3,704,597 | 12/1972 | Nicholds | 62/514 JT |
| 3,732,421 | 5/1973 | Kunimoto | 250/261 |
| 3,742,729 | 7/1973 | Zulliger | 62/514 R |
| 3,807,188 | 4/1974 | Lagodmos | 62/514 R |
| 3,851,173 | 11/1974 | Taylor et al. | 62/514 R |
| 3,859,523 | 1/1975 | Wilson et al. | 250/261 |
| 3,999,403 | 12/1976 | Bower et al. | 62/514 JT |
| 4,079,595 | 3/1978 | Kroebig | 62/514 R |
| 4,109,522 | 8/1978 | Thompson | 250/261 |

FOREIGN PATENT DOCUMENTS 2005395 4/1979 United Kingdom ............. 62/514 R

OTHER PUBLICATIONS

Testard et al.: "A Cryogenic Device for a Low Energy X-ray Space Detector" *Cryogenics*, 9/1974, pp. 509–510.
Cryostat pour Experiences D'Astronomie Spatiale Commissariat a L'Energie, Atomique, 1977, 2 pages.
"A Borehole Probe for In-situ Neutron Activation Analysis", Phase I Report, U.S. Dept. of Interior Bur. of Mines by Princeton Gamma-Tech, Inc., Mar. 31, 1978.

*Primary Examiner*—Ronald C. Capossela

[57] ABSTRACT

A borehole logging tool and cryostat therefor to maintain a semiconductor detector at cryogenic temperatures. The cryostat has an elongate single-phase heat sink of solid, thermally conductive material on which the detector is removably mounted. The other end of the heat sink is arranged to receive a liquid cryogen or the cold finger of a helium refrigerator, which is removed before a logging run; the detector being maintained at cryogenic temperatures during the logging run by absorption and retention of heat in the solid, single-phase heat sink.

8 Claims, 15 Drawing Figures

BOREHOLE LOGGING TOOL CRYOSTAT

BACKGROUND OF THE INVENTION

1. Field of the Invention

This invention relates to borehole logging tool cryostats for high-sensitivity photon detectors.

2. Description of the Prior Art

A technique of particular value in the exploration for oil or other hydrocarbons in sub-surface earth formations traversed by a borehole is that of gamma ray analysis. However, this technique frequently requires the use of high resolution semiconductor-crystal detectors, for example of high purity germanium (HP Ge) or lithium-drifted germanium (Ge (Li)), which operate reliably only at cryogenic temperatures, for example of the order of 90 K. ($-183°$ C.). The high ambient temperatures typically encountered in borehole logging up to and above 473 K. ($+200°$ C.), have thus been a serious obstacle to the use of semiconductor-crystal detectors in borehole exploration. Furthermore, space and other limitations place severe constraints on the techniques that may be applied in the design of cryostats for borehole logging tools, or sondes.

Much work has been done in the past on the maintenance of desired temperature conditions in equipment intended to operate in the borehole environment. This work has generally involved the use, alone or in combination, of conventional techniques of insulation, refrigeration, or cryogenic heat absorption.

Initially, the purpose of such work was merely to prevent equipment such as photomultiplier tubes from rising to temperatures at which damage could result, or to maintain temperature-sensitive devices at a uniform temperature. Thus, the target temperatures were at, or even somewhat above, ambient temperatures on the ground, and not the cryogenic temperatures required for high-resolution detectors. Subsequent work on the maintenance of true cryogenic temperatures in borehole equipment has involved the use either of a liquified-gas cryogen such as liquid nitrogen, or of a melting-solid cryogen such as propane or Freon-22 which is itself frozen using liquid nitrogen prior to a logging run. However, the use of such cryogens involves various problems.

A liquified-gas cryogen continuously evolves vapor. Additionally, there is always a significant risk of a borehole logging tool becoming stuck for many hours in a borehole, at an ambient temperature of as much as 423 K. ($+150°$ C.). Under these circumstances, even a melting-solid cryogen will ultimately change entirely to the gaseous state. In view of the high pressures encountered in deep boreholes, arrangements to vent vaporized cryogen may not operate effectively, thus creating a risk of explosion of the cryostat. Although it is possible to provide an expansion chamber to accommodate the vapor, a chamber of adequate volume, but sufficiently narrow to enter a borehole, would have to be several meters in length, and would be somewhat impracticable.

Accordingly, prior to the development of the present invention, conventional cryogenic techniques have been difficult or impossible to use in the context of a borehole logging tool, or have been unable to maintain sufficiently low temperatures for a period of adequate duration. Therefore, the art has sought a borehole logging tool cryostat capable of maintaining cryogenic temperatures without the problems presented by the prior art.

SUMMARY OF THE INVENTION

In accordance with the invention the foregoing has been achieved through the present borehole logging tool cryostat for a high-sensitivity photon detector. The borehole cryostat of the present invention comprises an avacuable housing of generally tubular form; an elongate single-phase heat sink of solid, thermally conductive material disposed within said housing for thermal contact with a photon detector to be maintained at cryogenic temperatures; and means for establishing thermal contact between said heat sink and a cooling means separate from said cryostat, prior to use of the cryostat, whereby the detector is maintained at cryogenic temperatures by absorption and retention of heat within said heat sink.

As indicated above, in more specific terms, the borehole cryostat of the present invention may include a layer of insulation disposed about the periphery of the heat sink. A further feature of the present invention is that the heat sink is made of copper or aluminum.

The borehole logging tool cryostat of the present invention, when compared with previously proposed prior art borehole logging tool cryostats has the advantages of: compactness for use in boreholes; durability; being capable of maintaining sufficiently low cryogenic temperatures for an extended period of time; and avoiding the problems of with vaporization of melting cryogenic materials associated with prior art cryostats.

BRIEF DESCRIPTION OF THE DRAWINGS

In the drawings:

FIG. 4 is a partial cross-sectional view taken along line IV—IV of FIG. 3a;

While the invention will be described in connection with the preferred embodiment, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

Figure 1:
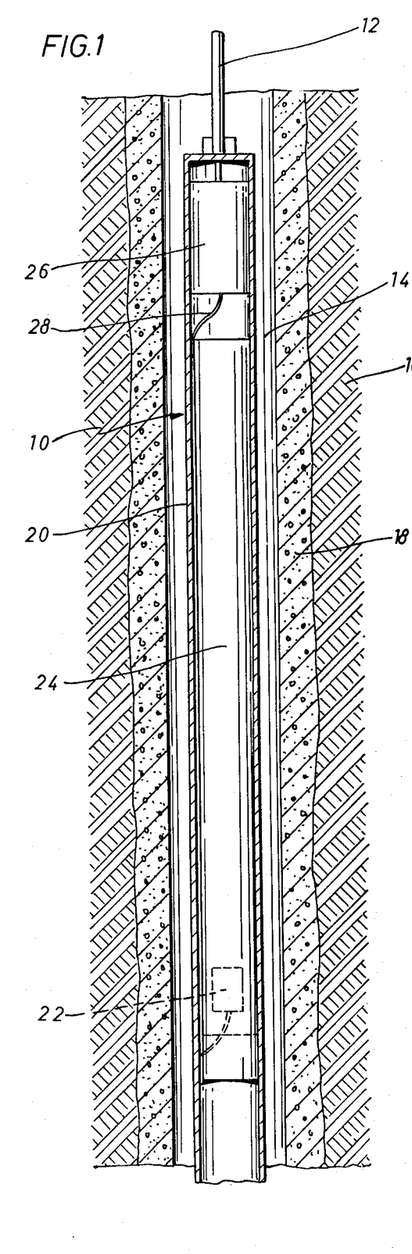
FIG. 1 is a schematic view of a logging tool incorporating a cryostat in a borehole.

Referring to FIG. 1, there is shown a borehole logging tool 10 suspended by a logging cable 12 in an oil well borehole 14 traversing an earth formation 16 to be explored. The borehole 14 is shown as a cased hole, having a cement annulus 18 formed therein, but the logging tool 10 could equally be used in an open hole.

The tool 10 includes, disposed within a pressure housing 20, a photon detector, or semiconductor-crystal gamma-ray detector 22 made of high purity germanium. In order to maintain the detector 22 at the cryogenic temperatures required for its operation, it is mounted at the lower end of a borehole logging tool cryostat 24 disposed in tool 10. An electronics section 26 is mounted above the cryostat 24 and is coupled to the detector 22 via a cable 28 disposed in a conduit between the pressure housing 20 and the cryostat 24. Electronics section 26 supplies the necessary high-voltage bias for the detector 22 and processes the detector signals preparatory to their transmission to the surface.

The logging tool 10 may be used to detect natural or artificial gamma rays emanating from the formation 16. If natural gamma rays are to be detected, the pressure housing 20 may simply be closed at its lower end with a conventional bullnose or endcap. However, when artificial gamma rays are to be generated and detected, a neutron source would be mounted within the pressure housing 20, generally below the cryostat 24, together with appropriate spacers and neutron shielding between the source and the detector 22.

Although the tool 10 is shown in FIG. 1 as comprising only the detector 22, cryostat 24 and electronics section 26, it will be understood that this assembly could be used, if desired, in combination with other assemblies in the same tool 10, to permit measurement of additional borehole parameters during a single logging run. Likewise, the tool 10 may also include other conventional features, for example means to bias the tool 10 against the wall of the borehole.

Although borehole temperatures frequently exceed 373 K. (+100° C.) and sometimes rise above 473 K. (+200° C.), semiconductor-crystal detectors must be operated at temperatures below 120 K. (−153° C.). Because of the great depths to which boreholes penetrate, it is sometimes necessary to operate a tool 10 for extended periods of time. Thus the detector 22 must be maintained at cryogenic temperatures for typically five hours at least, despite an ambient temperature of 423 K. (+150° C.). In addition, the tool 10, including cryostat 24, should be capable of withstanding ambient temperatures of 448 K. (+175° C.) for a shorter period of time of one or two hours. To provide for the possibility of the tool 10 becoming stuck for a prolonged period of time, it should be able to withstand being warmed throughout to 423 K. (+150° C.) without sustaining damage. Furthermore, the dimensions of the tool 10 must be compatible with existing borehole equipment; in particular, the outside diameter of the cryostat 24 should not exceed 70 millimeters to permit entry into smaller-sized boreholes. Additionally, the tool 10, including cryostat 24, must be sufficiently rugged to withstand the shocks and vibration typically encountered at a borehole site, both on the ground, and in the borehole during a logging run.

Figure 2:
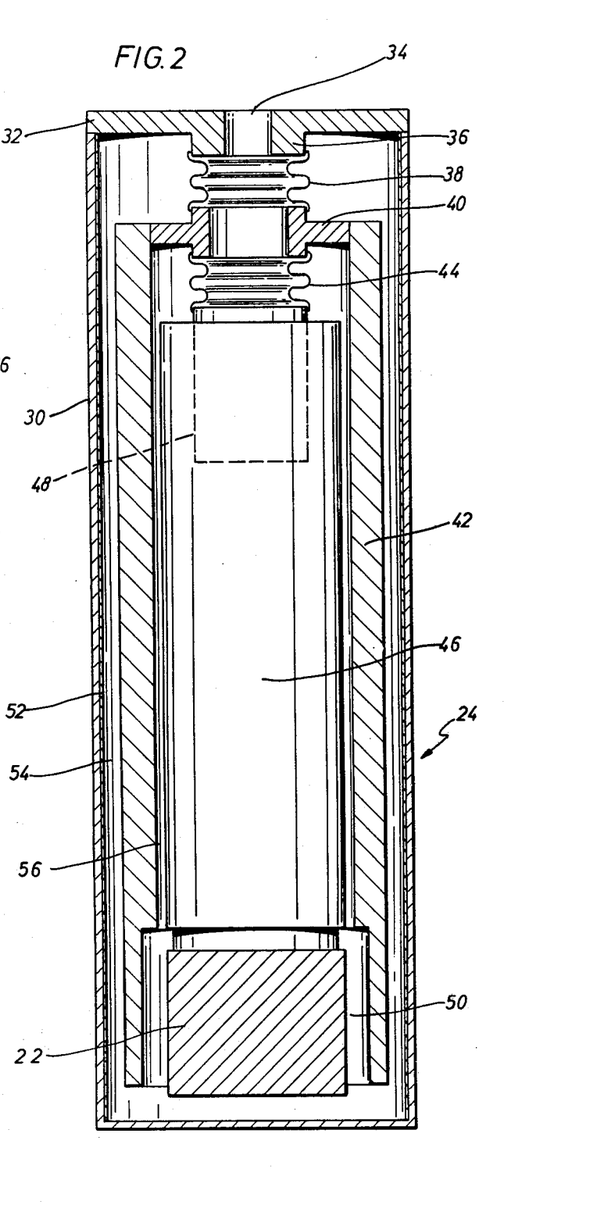
FIG. 2 is a schematic sectional view of a first form of borehole logging tool cryostat.

Referring to FIG. 2, the cryostat 24 has an evacuable stainless steel housing 30 of generally tubular form closed at its upper end by a stainless steel end cap 32. End cap 32 has a central aperture 34 encircled, on the lower face of the cap 32, by a flange 36 from which depends a first stainless steel bellows 38. The lower end of the bellows 38 carries an annular adaptor piece 40 of nickel. A rigid screening means, or tube 42, made of a thermally conductive material, is attached to the periphery of adaptor piece 40. A second stainless steel bellows 44 depends from the adaptor piece 40, and carries at its lower end an elongate single phase heat sink, or rod, 46 of solid thermally conductive material. The end of bellows 44 is secured to the periphery of a nickel boss 48 in the upper end of the rod 46. The lower end of the rod 46 carries the detector 22, within a chamber 50 formed by tube 42, as by a counterbore formed in the lower end of the tube 42.

The inner surface of the housing 30 may be treated to limit heat radiation therefrom, for example as by polishing, gold-plating, or, more conveniently, by covering it with a layer of aluminum or tantalum foil 52. More particularly, the outer surface of the tube 42 is thoroughly treated to limit heat absorption thereby, for example, as by cleaning and polishing and/or plating or covering it with foil. The surface of the rod 46, and, if desired, the inner surface of the tube 42, are likewise treated to limit radiative heat transfer between them. In the case of rod 46, this can conveniently be done by polishing.

The annular spaces 54 and 56 between, respectively, the housing 30 and the tube 42, and the tube 42 and the rod 46, are evacuated to less than $10^{-4}$ Torr prior to use of the cryostat 24, to reduce heat transfer from the housing 30 by convection and conduction. The arrangements for evacuation of housing 30, for support of the tube 42 and the rod 46 against the effects of shock and vibration, and for mounting of the detector 22, will be hereinafter discussed in detail with respect to FIGS. 3a–3d.

In use, the pressure housing 20 (FIG. 1) is separated at a joint (not shown) above the cryostat 24, so that a freezing agent such as liquid nitrogen (LN$_2$), or the cold finger of a helium refrigerator unit (now shown), can be brought into contact with the adaptor piece 40 and the boss 48 via the aperture 34. As a result, the rod 46 and the tube 42 are cooled to or below the boiling point of liquid nitrogen (77 K. (−196° C.)); heat being removed from the tube 42 by way of the adaptor piece 40. After replacement of the liquid nitrogen, or the cold finger, with a dry inert gas such as nitrogen or helium to prevent entry of humid air, the aperture 34 is closed off with a plug to minimize convection currents and associated heat transfer. Finally, the cable 12 is coupled to the electronics section 26, and the pressure housing 20 is re-connected together at the joint. The tool 10 is inserted in the borehole and the logging operation is then commenced.

In use the pre-cooled heat sink 46 maintains the desired low temperatures without the use of a refrigerator in tool 10. The adoption of a single-phase material, typically a metal having a melting point higher than the maximum temperature encountered in a borehole, precludes the use of the latent heat of fusion phenomenon to absorb heat. However, it has been found that the specific heat properties alone of a solid-phase, thermally conductive material can provide sufficient heat absorption as will be hereinafter discussed. At the same time, the hazards associated with the use of cryogens (dual-phase materials) in boreholes are avoided.

During the logging operation the detector 22 is kept cool by the insulating effects of the vacuum within the housing 30 and of the treatment of the surfaces of, at least, the rod 46 and the tube 42, and, primarily, by absorption of heat into the heat sink constituted by rod 46. The heat sinking provided by the rod 46 is significantly enhanced in the arrangement shown in FIG. 2 by the screening of the rod 46 and the detector 22 provided by thick walled tube 42, which augments the attenuation of radiative heat transfer provided by the treatment of the surfaces of the rod 46 and the tube 42. At the same time, the rigidity of the screening means, or tube 42, in contrast to the flexibility of other insulating arrangements such as aluminum foil and glass mat, permits the tube 42 to be incorporated in the mechanical structure of the cryostat in a manner providing the desired degree of ruggedness, as will be hereinafter discussed with reference to FIGS. 3a–3d.

Figure 12:
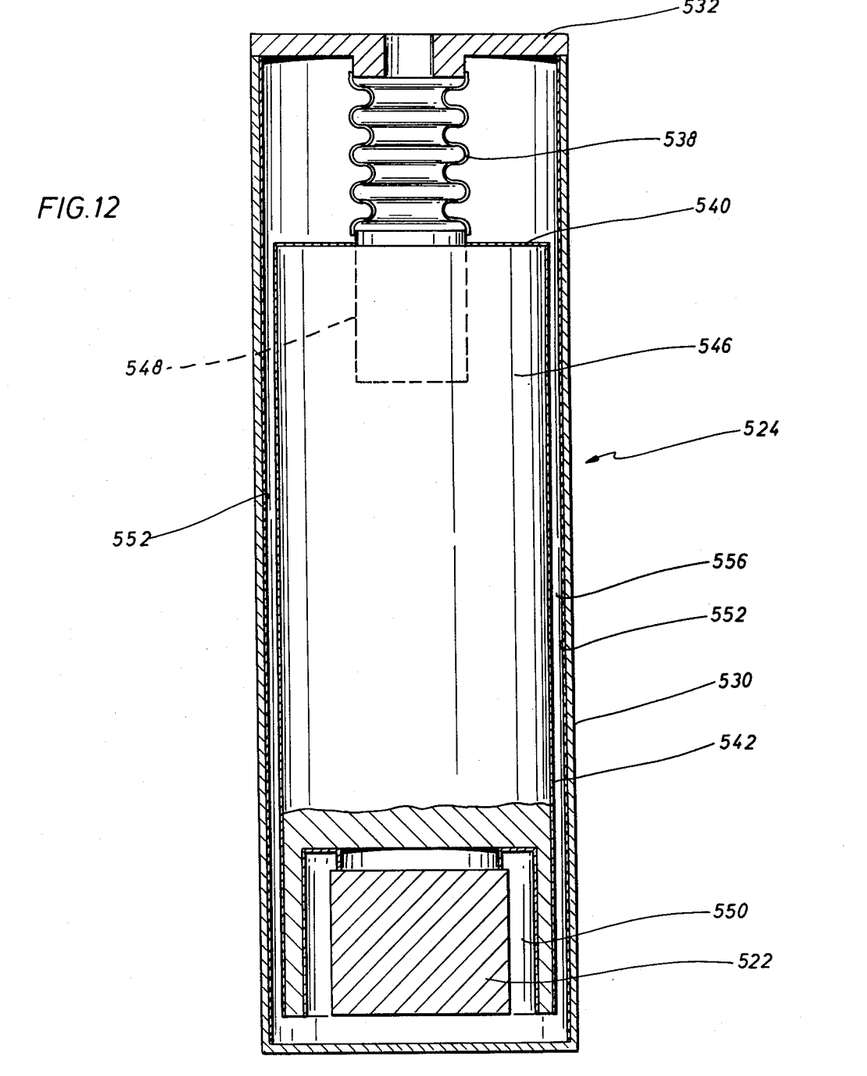
FIG. 12 is a schematic sectional view of a third form of a borehole logging tool cryostat.

A particularly advantageous configuration, shown in FIG. 2, is that in which the dimensions and materials of the tube 42 and the rod 46 are chosen so that the heat energy capacities of these two components are substantially the same order of magnitude. Of course, the heat energy capacity of the rod 46 itself is then reduced relative to other configurations; for example, when the rod 46 possesses most of the heat energy capacity and the tube 42 is a cylindrical shell, or when the tube 42 is replaced by a layer of insulation wrapped around rod 46, as will be hereinafter discussed with reference to FIG. 12. However, the effect which this reduction has on the time during which the detector 22 can be held at cryogenic temperatures is more than compensated for, by the effect of the increased heat energy capacity of the tube 42. The absorption of heat by the tube 42 significantly impedes the flow of heat to the rod 46, in particular in the initial period of heating, thus reducing the rate of temperature rise in the rod 46. In particular, the transfer of heat by radiation to the rod 46 is insignificant. Although the temperature of the tube 42 rises faster than that of the rod 46, the temperature gradients between the housing 30 and the tube 42, and between the tube 42 and the rod 46, remain smaller than that which would exist between, for example, the housing 30 and the rod 46 without the intermediate screening means or tube 42. Furthermore, the rate of radiative heat transfer between two bodies is dependent not only on the temperature gradient between the bodies, but is also approximately proportional to their absolute temperature $T_1$ and $T_2$, according to a relationship of the form $$e_1 T_1^4 - e_2 T_2^4$$

wherein $e_1$ and $e_2$ are the emissivities of the surface of the two bodies.

Although the tube 42 rises in temperature relative to the rod 46, it does so relatively slowly, and remains within a few tenths of degrees Celsius of the rod 46 for a considerable period of time—typically several hours. Thus, the value of the factor $T_1^4$ in the above relationship remains very much lower than if the tube 42 were not present, in which case $T_1$ would approach the temperature value of the housing 30. Thus the rate of heat transfer to the rod 46 is significantly reduced in comparison to the rate that would exist without the tube 42. The major element of the initial transfer of heat from the housing 30 affects only the tube 42, so that rod 46 remains at a relatively low temperature. Since the detector 22 is secured only to the rod 46 it also remains at the same low temperature. Thus, despite the lower overall heat capacity of the rod 46 in the configuration of FIG. 2, it can provide effective heat sinking for a longer period of time than if it were not screened by the tube 42 of similar heat capacity.

It has been found that if the tube 42 and the rod 46 are made of the same material, preferably aluminum or an aluminum alloy such as Dural, if heat transfer other than by radiation is neglected, and if a constant specific heat with temperature is assumed, an appropriate configuration for tube 42 and rod 46 is for tube 42 and rod 46 to be substantially equal in mass. However in practice, various factors must be taken into account. Since as noted above, the tube 42 rises significantly in temperature, it is possible to take advantage of the substantial rise with temperature of the comparatively high specific heat of aluminum, for example, by providing that the tube 42 has a smaller mass than the rod 46.

Since the temperature gradient between, and the absolute temperatures of, the tube 42 and the rod 46 remain relatively low, the surface-finishes of the rod 46 and the interior of the tube 42 are less important than that of the exterior of the tube 42. However, the outer surface of the rod 46, being accessible, is preferably polished.

The choice of material for the tube 42 and the rod 46 is influenced primarily by the volumic heat, or the heat capacity per unit volume, with a view toward maximizing heat energy capacity, while minimizing mass and the associated problems of supporting such mass against vibration and shock. In this respect, aluminum, or an aluminum alloy, provides a particularly convenient compromise, since it has a relatively high volumic heat and very low density. Copper has a very high volumic heat, but also has a relatively high density. However, the problems associated with copper's density can be alleviated by adopting the configuration of FIG. 2, with the rod 46 being made of copper and the tube 42 being made of aluminum. This combination provides a high heat capacity in the rod 46 and a relatively high heat capacity in the tube 42 which rises with temperature, without incurring excessive mass. Another possible material for the tube 42 and/or the rod 46 is magnesium.

The use of the permanently solid rod 46, as a heat sink in the cryostat 24 can provide, in combination with the tube 46 in the case of the configuration of FIG. 2, at least the same heat energy capacity as a practical conventional design using a cryogen such as a melting solid and also enable the detector 22 to be maintained at suitable cryogenic temperatures for a longer period of time. At the same time, the problems of vaporization and the dangers of explosion upon exposure to high temperatures for prolonged periods of time, associated with cryogens are avoided.

In view of the considerable range of possible temperature differences between the housing 30 and the tube 42 and rod 46 combination (from a 0° C. difference when the entire tool 10 is at normal ground temperatures or has been warmed throughout after becoming stuck in a borehole, to a 350° C. difference when the housing 30 and the tube 42 and rod 46 are at their respective operating temperatures during a logging run), there are significant differential length changes. For a typical cryostat 24 having a housing 1.1 meters long, a tube 0.9 meters long and a rod 0.66 meters long, the total relative change in lengths between the hot and cold components is about 4 millimeters. Clearly a practical design must take this, as well as other factors discussed above, into account, and the details of one such practical implementation of the arrangement illustrated in FIG. 2, will now be described in greater detail with reference to FIGS. 3 to 10.

Referring first to FIGS. 3a to 3d, in which parts corresponding to those shown in FIG. 2 have similar reference numerals prefixed by 1, a tube 142 of aluminum alloy, such as Dural, is mounted within a stainless steel housing 130 and surrounds a Dural rod 146. The tube 142 is secured by bolts 160 to the lower end of a nickel adaptor piece 140. The choice of Dural for the tube 142 is influenced by the need for a material sufficiently hard to provide a strong screw thread to engage the bolts 160. The upper end of the adaptor piece 140 is argon-welded to a stainless steel bellows 138; nickel being chosen for the adaptor piece 140 to facilitate bolt this welding and for its good thermal conductivity. The bellows 138 is in turn welded to a flange 136 on a stainless steel end cap 132; stainless steel being chosen for these components in part because of its poor thermal conductivity. The end cap is itself welded to the upper end of the housing 130. The aperture 134 in the end cap 132 is closed by a plug 135, except when the cryostat 24 is being cooled prior to a logging run.

Figure 3A:
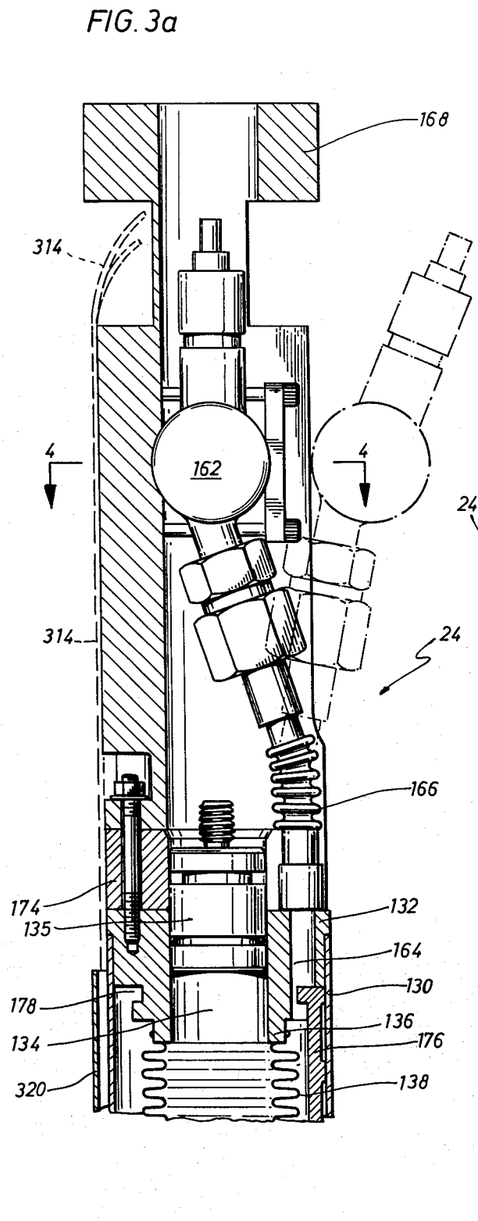
FIGS. 3a–3d are a cross-sectional view of a borehole logging tool cryostat of the form shown in FIG. 2 in more detail.
Figure 4:
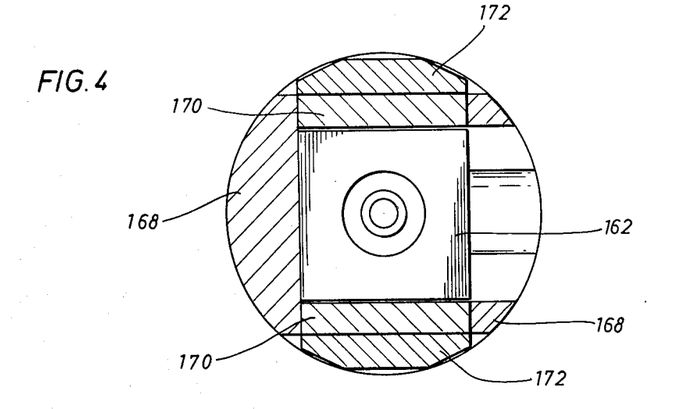

In order to maintain the vacuum in the annular spaces 154 and 156 between the housing 130 and the tube 142, and between the tube 142 and the rod 146, an ionic vacuum pump 162 is provided at the top of the cryostat 24. This pump 162 is coupled to the interior of the cryostat 24 via a passageway 164 in the end cap 132 and a flexible bellows 166 which enables the pump 162 to be swung out from the cryostat 24 to the position shown in dotted lines, to permit access to the aperture 134. During normal operation the pump 162 is clamped to a connector 168 mounted above the end cap 132 and by means of which the cryostat 24 is joined to other assemblies making up a complete logging tool 10 as shown in FIG. 1. The ionic pump 162 requires a magnetic field for its operation, and, as shown in FIG. 4, this is provided by two discs 170 of a samarium-cobalt permanent-magnet compound, located, on each side of the pump 162, in the connector 168 which is itself non-magnetic. The magnetic circuit between the discs 170 is completed via two magnetically permeable steel plates 172 extending down the connector 168 to a permeable steel ring 174 clamped between the connector 168 and the end cap 132.

The adaptor piece 140, and thus the upper end of the tube 142, are positioned in the housing 130 by three vertical stainless steel arms equispaced around the adaptor piece 140, one of these arms being indicated at 176. The upper ends of these arms engage the housing 130 and a circumferential groove 178 in the end cap 132. Their lower ends project into respective recesses 180 in the adaptor piece 140, as best shown in FIGS. 5 and 6.

Figure 5:
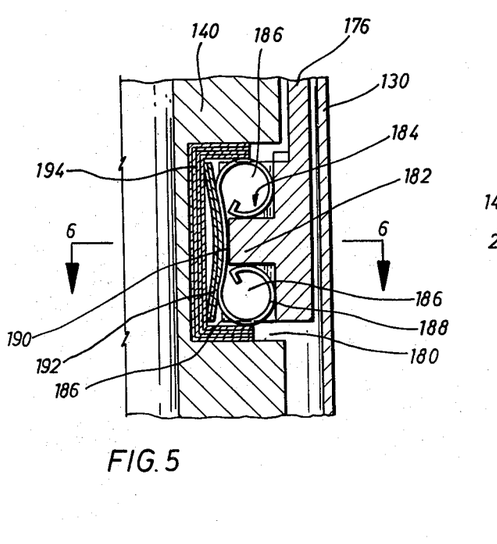
FIG. 5 is an enlarged fragmentary view of part of FIG. 3b.
Figure 6:
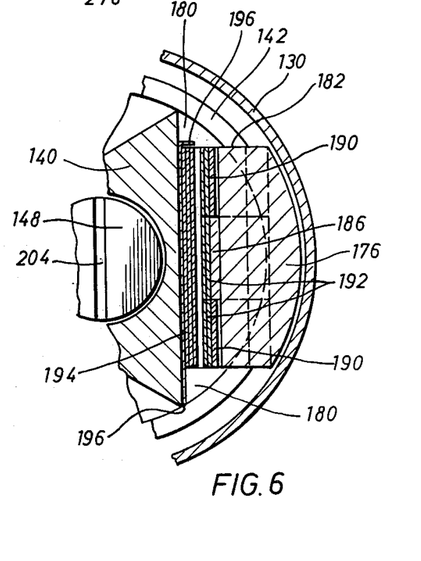
FIG. 6 is a cross-sectional view taken along line VI—VI of FIG. 5.

Referring to FIGS. 5 and 6, the lower end of each arm 176 has a horizontal rib 182 projecting towards the adaptor piece 140 and straddled by two curved springs 184 and a squat U-shaped block 186 which is sandwiched between the springs 184. Each spring 184 comprises two circular portions 188 joined by a bridge section 190, and each circular portion 188 lies in a niche bounded by the rib 182, an arm of the block 186 and the inner face of the arm 176, with the bridge section 190 extending across the rib 182. In the absence of any applied force, the periphery of each circular portion 180 of springs 184 is slightly spaced from the faces of the block 186 facing the adaptor piece 140, whereas each bridge section 190 is flush with the adjacent face of the block 186. A leaf spring 192, having a shallow V-shaped form, is disposed with its vertex abutting the bridge sections 190 of the curved springs 184 and the middle of the U-shaped block 186, and with the ends of its arms engaging a channel member 194 in the recess 180. The upper and lower extremities of the circular portions 188 of the curved springs 184 also engage this channel member 194.

The channel member 194 is preferably a four-layer laminated construction, comprising: a layer of stainless steel sheet next to the adaptor piece 140; a layer of stainless steel wire mesh; a second layer of stainless steel sheet; and a second layer of stainless steel wire mesh. Of course a greater or lesser number of layers of steel sheet and wire mesh could be utilized. This construction is chosen to minimize thermal conduction, which is already limited by the poor thermal conductivity of stainless steel, and provides a restricted and tortuous path for heat flow. In addition, under normal circumstances, the force applied by a leaf spring 192 is such that the only heat path between the arm 176 and the adaptor piece 140 is via the limited area of contact of the edges of the springs 184 and 192 with the channel member 194, and of the vertex of the spring 192 with the bridge sections 190 and the block 186. In particular, there is very little permanent contact with the main face of the block 186 which faces the adaptor piece 140. The strength of the first spring member, or leaf spring 192 is such as to maintain the nominal configuration of the housing 130 and tube 142 irrespective of the orientation of the cryostat 24, and despite vibration, or dimensional changes caused by temperature fluctuations. However, in the event of a sudden shock, deformation of the leaf spring 192 and, more particularly, of the stiffer second spring member, or curved springs 184, allows temporary large area contact between the leaf spring 192 and the face of the block 186, in order to sustain the load thus imposed and resist and dampen such shock forces.

As shown in FIG. 6, each edge of the innermost layer of stainless steel sheet in the channel member 194 is provided with flanges 196 which engage the edges of the recess 180 and of the leaf spring 192 to maintain their relative disposition. It can be seen that the means for mounting tube 142 via adaptor piece 140, or the suspension arrangement described above, provides a rugged mounting with very low thermal conductivity, despite the extremely limited space constraints of a borehole tool. It also avoids the use of screw-threaded components, with their associated problems of cleaning and evacuation to avoid deterioration of the desired vacuum conditions in the cryostat 24. Furthermore, this configuration permits a limited amount of longitudinal movement of the adaptor piece 140 relative to the housing 130.

Figure 3B:
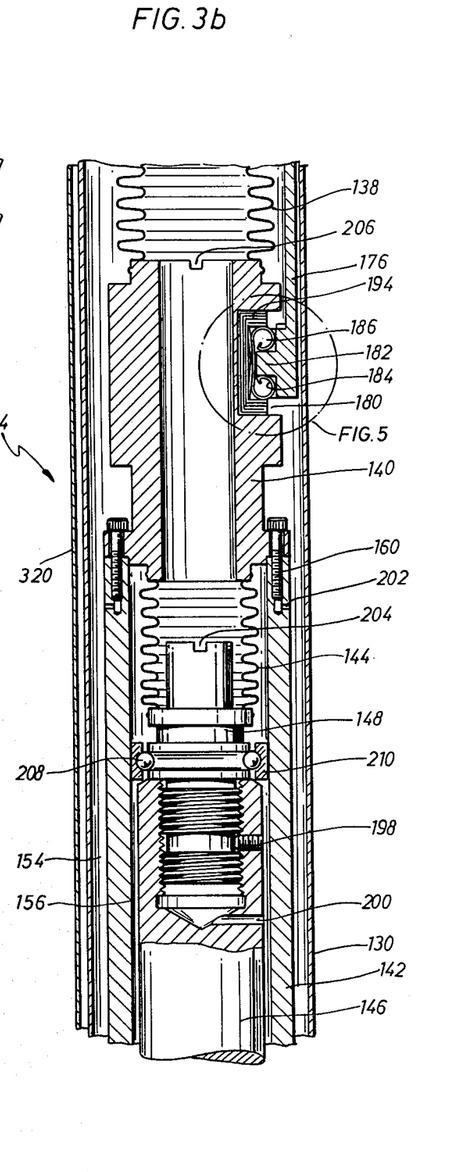

Referring again to FIG. 3, and in particular FIG. 3b, a stainless steel bellows 144 is argon welded to the bottom of the adaptor piece 140 and to a flange intermediate the ends of nickel boss 148. Boss 148 is threaded at its lower end and is secured in a matching threaded hole in the top of the rod 146. A grub screw 198 locks the rod 146 to the boss 148, and a bleed hole 200 ensures proper evacuation of the enclosed cavity left in the rod 146. Similar bleed holes 202 ensure evacuation of the screw-threaded holes in the tube 142 which receive the bolts 160.

The top of the boss 148 has a slot 204 formed therein to enable the boss 148 and the rod 146 to be locked against angular rotation relative to the housing 130 as will be described hereinafter. The top of the adaptor piece 140 has a similar slot 206, but in this case to provide a passage for gas flow when a cold finger is being used to cool the cryostat 24.

The upper end of the rod 146 is positioned laterally relative to the tube 142 by an annular coil spring 208 located in a groove in the boss 148 and in a matching groove in a collar 210. The simple arrangement is practical in view of the relatively small differences in temperature which can arise as between the tube 142 and the rod 146.

Figure 3C:
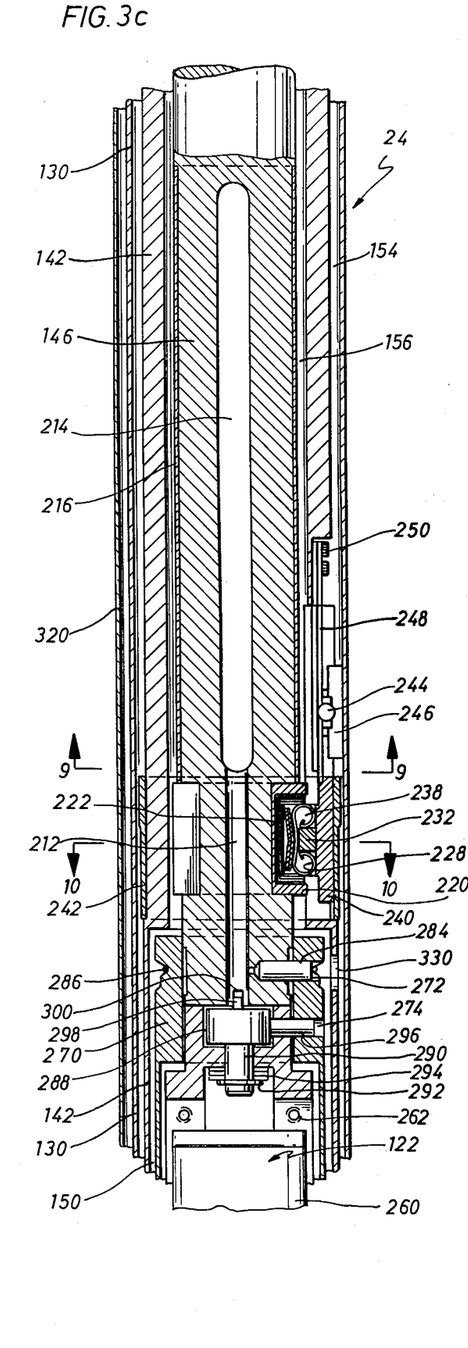

Referring now to FIG. 3c, the lower end of the rod 146 has an axial hole 212 and a transverse slot 214 formed therein. The slot 214 extends across the full width of the rod 146 and is closed by a sleeve 216 which is, however, perforated to provide gaseous communication with the annular spaces 156 and 154. The slot 214 is intended to be filled, via the hole 212, with zeolites, and if desired, an active getter material, to scavenge gas molecules at cryogenic temperatures and thus help maintain the vacuum within the cryostat 24.

Figure 8:
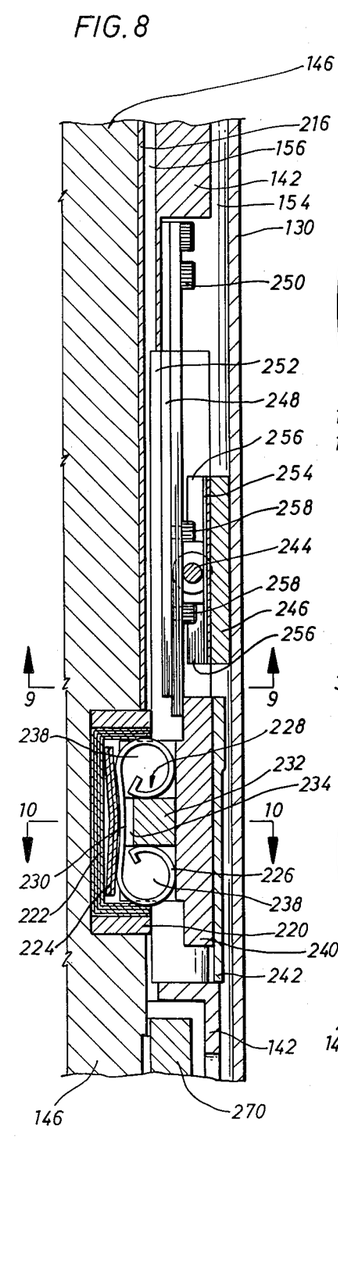
FIG. 8 is an enlarged fragmentary view of part of FIG. 3c.
Figure 9:
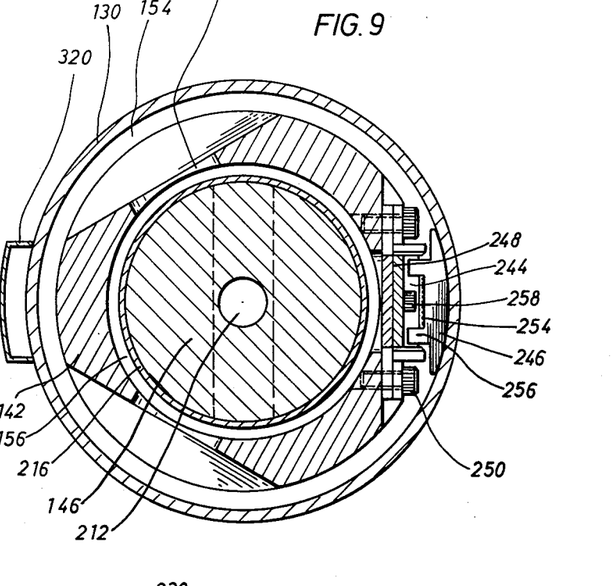
FIG. 9 is a cross-sectional view taken along line IX—IX of FIGS. 3c and 8.
Figure 10:
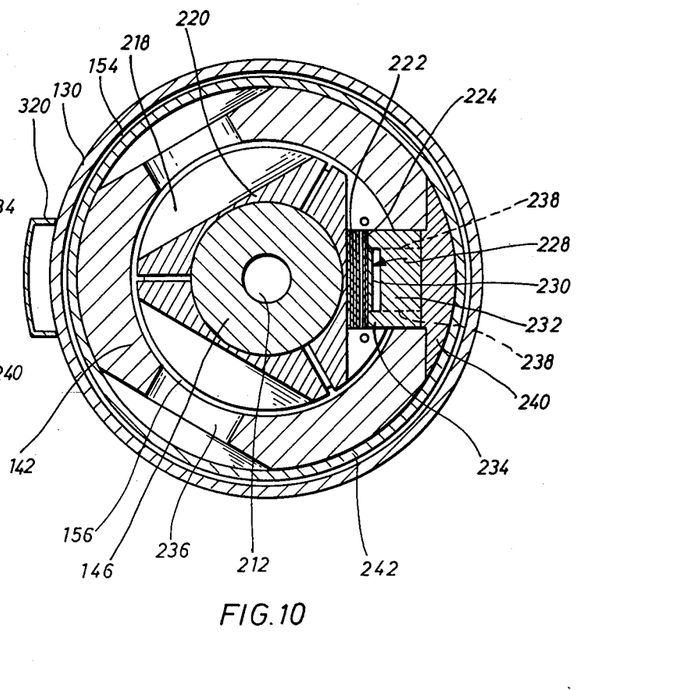
FIG. 10 is a cross-sectional view taken along line X—X of FIGS. 3c and 8.

The means for mounting rod 146, or the suspension arrangement for positioning the lower end of the rod 146 relative to the tube 142, is similar in principle to that for the top of the tube 142 itself. Thus, and as best shown in FIGS. 8 and 10, three equi-angularly spaced recesses 218 are provided in respective filler pieces 220 mounted on a reduced-diameter portion of the rod 146. This arrangement avoids any need for precise angular positioning of the rod 146 relative to the tube 142 during assembly. Each of these filler pieces 220 contains a channel member 222 which is of similar construction to the channel member 194, but has only three layers, as follows: a layer of stainless steel sheet next to the filler piece 220; a layer of stainless steel wire mesh; and a second layer of stainless steel sheet. This channel member 222 is engaged by the ends of the arms of first spring member, or V-shaped leaf spring 224, and by the extremities of the circular portions 226 of a second spring member, or curved spring 228. These springs 224 and 228 are respectively similar to the springs 192 and 184 shown in FIG. 5. A bridge section 230 of the spring 228 straddles the center of a squat U-shaped block 232, and lies flush with the ends of the arms 234 of this block 232. The block 232 is disposed in a respective one of three equi-angularly spaced rectangular apertures 236 in the tube 142, between two pairs of plates 238 projecting inwardly from a support 240. The support 240 is held against the tube 142 by a cylindrical retaining ring 242. It should be noted that, for the sake of clarity, the details of only one of the three suspension arrangements around the lower end of the rod 146 have been shown in FIG. 10, and likewise in FIG. 9 to be described below.

As is the case with the suspension arrangement for the adaptor piece 140 described above, in the absence of any applied force, the periphery of each circular portion 226 of the curved spring 228 stands slightly spaced from the faces of the plates 238 on each side thereof, these faces being themselves flush with the ends of the arms 234 of the block 232 and with the bridge section 230 of the spring 228. In addition, the leaf spring 224 is in contact only with the bridge section 230 and the ends of the arms 234, along the line of its vertex. Thus the nominal disposition of the rod 146 and the tube 142 is maintained irrespective of vibration, or of changes in temperature or orientation, and at the same time thermal conduction is kept to a minimum. However, in the event of a sudden shock, deformation of the leaf spring 224 and, more particularly, of the stiffer curved spring 228 allows temporary large area contact between the leaf spring 224 and the end faces of the plates 238 and of the arms 234, in order to sustain the load and dampen the shock forces thus imposed.

Like the suspension arrangements for the adaptor piece 140, the arrangement shown in FIGS. 8 and 10 permits a limited amount of relative longitudinal movement, in this case as between the rod 146 and the tube 142. This is of particular significance in relation to the cooling of the cryostat using a helium refrigerator cold finger, which should be brought into intimate thermal contact with the upper faces of the adaptor piece 140 and the boss 148 (shown in FIG. 3b). In order to promote such good thermal contact, the distance between the corresponding mating surfaces of the cold finger is made some 0.5 millimeters longer than the nominal spacing between the upper surfaces of the adaptor piece 140 and the boss 148. Thus when the cold finger is introduced into the cryostat 24, it will first contact the end of the boss 148, and then depress the boss 148 and the rod 146, in the process compressing the spring 228, until the cold finger also comes into contact with the upper face of the adaptor piece 140. Additional pressure on the cold finger will then ensure intimate contact with this end face of the adaptor piece 140. If during the cooling process thermal contact with either the adaptor piece 140 or the boss 148 should become impaired, the rate of cooling, and thus of thermal contraction, of either the tube 142 or the rod 146 respectively will be reduced, and this will have the effect of automatically restoring the impaired thermal contact to its previous condition. Thus cryostat 24 is provided with a means for establishing thermal contact between rod 146, tube 142 and the cold finger.

Whereas the suspension arrangements for the adaptor piece 140 and the lower end of the rod 146 only have to accommodate relatively minor longitudinal movements, due to the relatively small temperature differences which can arise between the tube 142 and the rod 146 or due to the use of a cold finger as described above, the means for mounting the lower end of tube 142, or the suspension arrangement for the lower end of the tube 142, must accommodate the substantial differential changes in length, of the order of 4 millimeters, as between the tube 146 and the housing 130, as noted earlier. To this end, and as best shown in FIGS. 8 and 9, each of the three suspension arrangements for the lower end of the tube 142 involves a roller 244 which runs between a skid member 246 in contact with the housing 130 and a strong leaf spring 248 secured to the tube 142 by screws 250 at the upper end of an elongate aperture 252 in the tube 142. The face of the skid member 246 is covered by a layer of stainless steel wire mesh and a layer of stainless steel sheet, indicated jointly at 254, in order to limit thermal conduction between the skid member 246 and the roller 244. The extent of travel of the roller 244 is limited by upstanding lugs 256 on the skid member 246, and by bolts 258 in the leaf spring 248. Contact between the roller 244 and the skid member 246, and between the skid member 246 and the housing 130, is maintained solely by the pressure of the leaf spring 248. Thus, the suspension arrangements at the lower end of the tube 142 allow free movement of the lower end longitudinally within the housing 130, whereas the suspension arrangement at the upper end of the tube 142 provides positive longitudinal location of that upper end within the housing 130.

It can be seen that the various suspension arrangements shown in FIG. 3 provide rugged support both transversely and longitudinally for the rod 146 and the tube 142, while at the same time keeping to a minimum thermal conduction between these components and also, and more importantly, between the tube 142 and the housing 130.

In this latter respect, it can be noted that every heat conduction path via solid material between the housing 130 and the tube 142, and between the tube 142 and the rod 146, includes a stainless steel component, that is either one of the bellows 138 and 144, or a laminate of stainless steel sheet and stainless steel wire mesh. These components present a considerable barrier to the flow of heat, both by virtue of the poor conductivity of stainless steel, and, in the case of the laminates, by virtue of the restricted area of contact between the different sheets in the laminate, and in the case of the bellows 138 and 144, by virtue of their serpentine shape.

At the lower end of the cryostat 24 (FIGS. 3c and 3d) a chamber 150 for a detector 122 is formed. Chamber 150 is defined by the lower end of tube 142, as by a counterbore in the lower end of the tube 142. The detector 122 itself comprises a semiconductor crystal 260 in a Dural holder 262 which is mounted on the end of the rod 146. In order to ensure an intimate mechanical and electrical contact between the crystal 260 and the two halves of the holder 262, the crystal is surrounded by a thin layer of a soft metal (not shown), for example lead, which is chosen to have a melting point higher than the maximum temperature to which the cryostat is likely to be exposed. The lower end of the holder 262 carries a printed circuit board 264, which holds an FET preamplifier 266 and a temperature sensor (not shown) and is enclosed within a stainless steel thermal shield 268. It will be understood that the biasing arrangements for the detector crystal 260 must be appropriately chosen in view of the fact that the crystal 260 and the holder 262 are directly connected to the rod 146, that is at ground potential.

Figure 7:
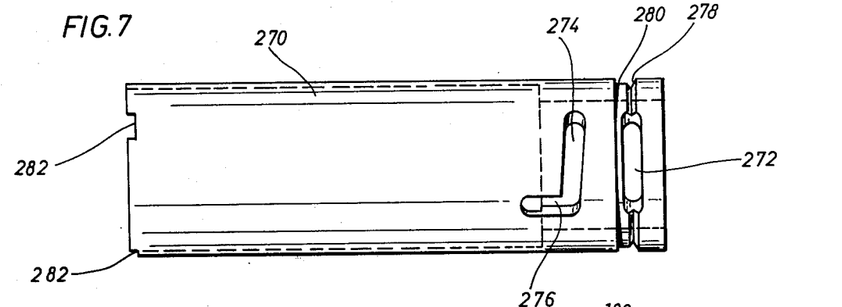
FIG. 7 is a side view of a socket forming part of the borehole logging tool cryostat of FIGS. 3c–3d.

The detector 122 is arranged to be mounted and demounted without disassembly of the cryostat 24. To this end, the detector 122 is located within a socket 270 which is rotatably secured to the end of the rod 146. As shown in FIG. 7, the wall of the socket 270 is of increased thickness at its upper end (the right-hand end as viewed in FIG. 7). In this increased thickness wall section, there are two sets of three slots each, a first set 272 being close to and parallel with the end of the socket 270 and a second set 274 being spaced from and extending obliquely to the first set 272. Each slot subtends the same angle at the center of the socket 270, and the end of each slot 274 which is farther from the upper end of the socket 270 is extended parallel to the axis of the socket 270 beyond the end of the increased thickness wall section, as indicated at 276. In addition there is a circumferential groove 278 running around the socket 270 and joining each of the slots 272. One side of this groove 278 is extended a short way along the socket 270 to form a reduced diameter neck 280. The lower end of the socket 270 has three recesses 282 formed therein at equally spaced positions around its circumference.

The socket 270 is secured to the rod 146 by means of three pins 284 which are located in corresponding holes in the end of the rod 146 and which project into respective ones of the slots 272. These pins are retained in position by a circular clip 286 disposed in the groove 278 (see FIG. 3c). The upper end of the detector holder 262 has a recess 288 holding a short rod 290 which is secured in place by a circular clip 292 and a spring 294 on the end of the rod 290 within the holder 262. The rod 290 has three studs 296 projecting radially therefrom through corresponding holes in the end of the detector holder 262. The upper end of the rod 290 has two projections 298 arranged to engage in corresponding slots 300 in the lower face of the rod 146, on each side of the hole 212. The thermal shield 268 at the lower end of the detector holder 262 carries a threaded stud 302.

When the detector 122 is to be mounted or demounted, the boss 148 (see FIG. 3b) is first locked against rotation relative to the housing 130 by insertion of a tool (not shown) into the top of the cryostat 24 to engage both with the housing 130, for example by way of the end cap 132, and with the slot 204 in the top of the boss 148. This expedient is necessary to avoid the application of torque to the bellows 138 and 144. Thereafter the detector 122 is coupled to the end of a tool (not shown) by means of the threaded stud 302. This tool also has three retractable teeth arranged to engage in the recesses 282 in the bottom of the socket 270. Assuming the detector 122 is to be demounted, these teeth would be extended to engage with the slots 282, thereby permitting the socket 270 to be rotated relative to the rod 146 (this being locked in position via the boss 148) in a counterclockwise direction as viewed from the bottom of the socket 270. During this rotation, the socket 270 would slide relative both to the pins 284 projecting through the slots 272, and to the studs 296 projecting into the grooves 274 from the rod 290, the latter being secured against rotation by the projections 298 in the slots 300 in the end of the rod 146. When the socket 270 has been rotated as far as possible, bringing the studs 296 into line with the extensions 276 of the slots 274, the teeth engaged in the recesses 282 would be retracted. Then the detector 122 could be withdrawn from the socket 270 on the end of the tool, the studs 296 passing along the extensions 276 in the process. Mounting or remounting of the detector 122 would involve the reverse of this operation, the socket 270 being turned clockwise, during which operation the studs 296 and thus the rod 280 would be drawn towards the rod 146 in view of the oblique direction of the slots 274. This would have the effect of compressing the spring 294, thereby ensuring an intimate thermal contact between the upper face of the detector holder 262 and the end face of the rod 146.

Figure 3D:
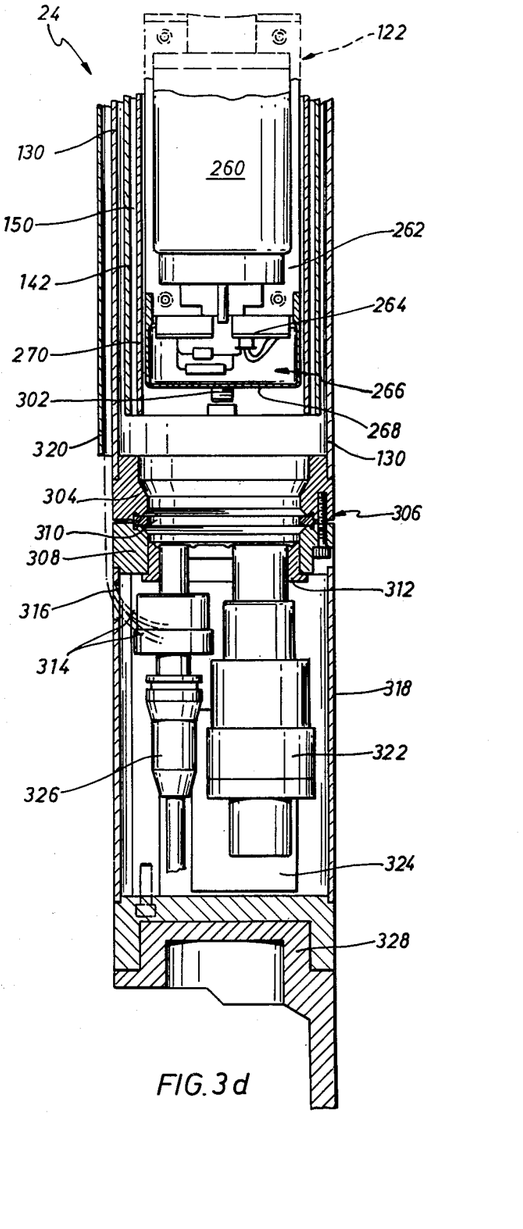

The bottom of the housing 130 is welded to an end cap 304 which forms one half of a vacuum seal assembly 306. The other half of this assembly 306 is formed by an annulus 308 which is bolted to the end cap 304 to clamp therebetween a sealing ring 310. This sealing ring 310 comprises an electrically annealed copper annulus which is lapped and gold-plated.

The center of the annulus 308 is closed by a disc 312 which carries feedthroughs of conventional design (not shown) for the leads 314 from the preamplifier 266 and the temperature sensor, and to supply the high voltage bias for the detector 122. These leads 314 extend through a hole 316 in a protective cover 318 mounted on the annulus 308 and then up the side of the cryostat 24 in a conduit 320. The disc 312 also carries a vacuum pump-out valve 322, further preamplifier circuitry 324 and a vacuum gauge 326. The end of the protective cover 318 is closed by a connector 328 by means of which a neutron source, for example, can be coupled to the lower end of the cryostat 24.

The temperature sensor and the vacuum gauge 326 are provided to enable the conditions within the cryostat 24 to be monitored. In particular the detector bias and the preamplifier power supply would be turned off by the electronics section 26 (FIG. 1) to prevent degradation of the preamplifier FET and the detector 122 if the temperature rose too high.

The end cap 304 has a central aperture of sufficient diameter such that after disconnection of the leads 314 and removal of the annulus 308, the detector assembly 122 can be removed and replaced through the end cap 304 without disassembly of the cryostat 24, as previously discussed.

Whenever the cryostat 24 has been re-sealed after maintenance, for example, the housing 130 is initially evacuated via the vacuum pump-out valve 322, which is then closed. The vacuum is thereafter maintained by the ionic pump 162, and by the zeolites and getter material in the slot 214 in the rod 146. This process is aided by the nearly all-metal construction of the cryostat 24, and the use of welded connections to minimize out gassing. It is envisaged that with a sufficiently effective getter material in slot 214, it may be possible to omit the ionic pump 162.

It is envisaged that, in practice, a special cooling unit would be provided to accommodate the cryostat 24 during cooling prior to use of the cryostat 24, this unit including a reservoir of liquid nitrogen or a helium refrigerator as appropriate, together with the appropriate arrangements for supporting the cryostat 24 and coupling it to the cooling equipment as discussed earlier. In addition, the unit would be arranged to ventilate the interior of the adaptor piece 140 and the bellows 138 and 144 with nitrogen gas to prevent condensation of moisture within these cooled components, as also previously discussed. Likewise, the same unit could be arranged to support the cryostat 24, and engage the slot 204 in the boss 148, preparatory to removal of the detector 122.

An advantage of the construction shown in FIG. 3 is that, as the cryostat 24 is designed throughout to withstand prolonged exposure to temperatures of at least 433° K. (160° C.) during which the whole cryostat may reach this temperature, radiation damage sustained by the semiconductor crystal 260 can be easily healed without dismantling the cryostat 24. To this end the crystal 260 (and therefore the whole cryostat 24) is raised to a temperature of 433° K. (160° C.) for one hour to anneal the crystal 260. Thereafter, the housing 130 is re-evacuated via the pump-out valve 322 as described above.

The general sequence of assembly of the cryostat 24 shown in FIGS. 3a–3d is as follows:

1. The end cap 132, the adaptor piece 140 and the boss 148 are welded to the bellows 138 and 144 while mounted in a jig (not shown) which maintains the correct angular orientation as between the end cap 132 and the boss 148. The orientation of the adaptor piece 140, in contrast, is unimportant since the arms 176, whose positions are determined by the position of the recesses 180 in the adaptor piece 140, can occupy any position in the groove 178 which completely encircles the end cap 132;

2. The rod 146 is screwed onto the end of the boss 148 and locked in place, the sleeve 216 is slid onto the end of the rod 146, and the cylindrical retaining ring 242 is placed loosely over the tube 142;

3. The rod 146 is inserted into the tube 142 from the top, the upper suspension arrangement for the rod 146, comprising the spring 208 and the collar 210, and also the filler pieces 220 for the lower suspension arrangement of the rod 146 being inserted at the same time;

4. The circular clip 286 is placed over the neck 280 of the socket 270, which is then inserted into the chamber 150 at the bottom of the tube 142 and secured to the end of the rod 146. This is done by inserting the pins 284 into the grooves 272 and the corresponding holes in the end of the rod 146 via a hole 330 which is provided in the wall of the tube 142 for this purpose. The tube 142 is turned relative to the rod 146 during this operation to bring each groove 272 into line with the hole 330 in turn, and when all the pins 284 are in place, the circular clip 286 is moved into the groove 278 to retain them there. Thereafter the tube 142 can be bolted to the adaptor piece 140;

5. The components of the lower suspension arrangement of the rod 146 are assembled, and the retaining ring 242 slid over them to hold them in place;

6. The components of the upper and the lower suspension arrangements for the tube 142 are then assembled, being temporarily held together by bands placed around the assembly;

7. Thereafter the housing 130 can be carefully drawn over the assembly, the temporary bands being removed as the upper end of the housing reaches first the lower suspension arrangement and then the upper suspension arrangement for the tube 142, and then the housing 130 is welded to the end cap 132. While the housing 130 is being slid over the assembly, each roller 244 in the lower suspension arrangement for the tube 142 will become caught between the lower flanges 256 of the associated skid member 246 and the upper bolt 258 on the associated leaf spring 248. Thus, when the cryostat is cooled, the maximum extent of travel of the rollers 244 will be available as the rod 146 and the tube 142 shrink (upwards in the view of FIG. 8) relative to the housing 130;

8. Thereafter the rest of the cryostat can be assembled, the zeolites inserted into the slot 214, and the detector 122 mounted in the chamber 150 as described above.

The dimensions of the cryostat 24 will depend on particular circumstances; typically the rod 146 may be 0.66 meters long by 4 centimeters in overall diameter; the tube 142 may be 0.9 meters long with an internal diameter over most of its length of 4.4 centimeters and a corresponding external diameter of 6 centimeters; and the housing 130 may be 1.1 meters long with an internal diameter over most of its length of 6.6 centimeters and a corresponding external diameter of 7 centimeters. It is noted that, although the ratio of heat capacity (related to volume) to radiative heat absorptivity (related to surface area) does not change with changes in length, the relative importance of heat transfer by conduction through the various suspension arrangements decreases with increasing length, since, within limits, the number of such suspension arrangements need not change with length.

Figure 11:
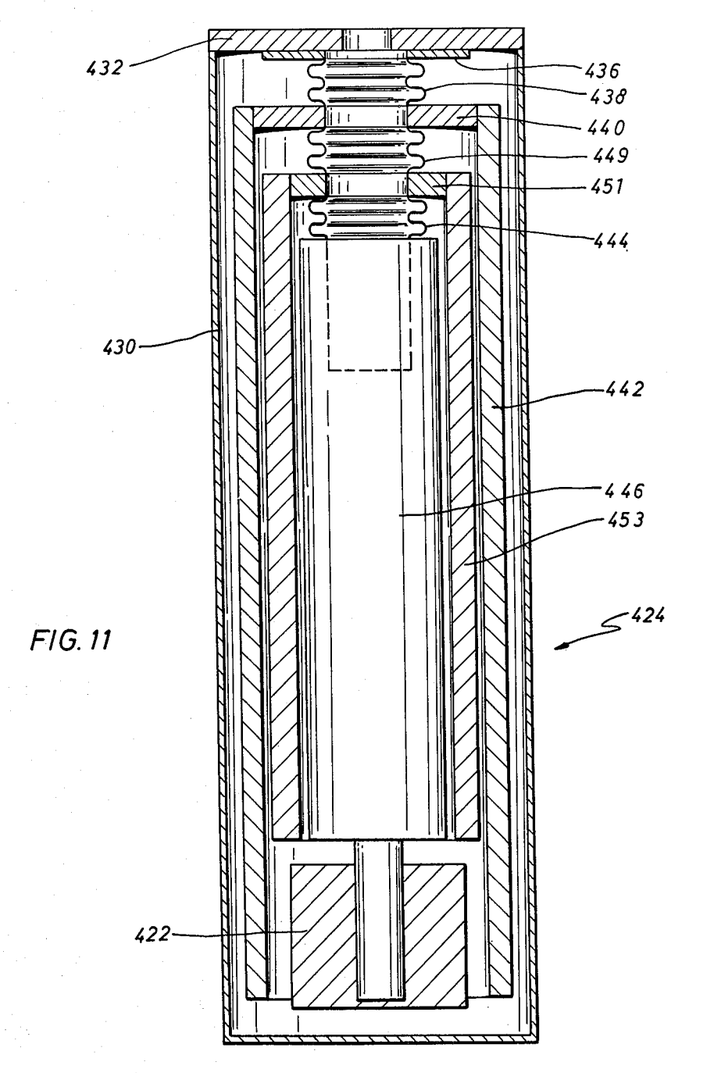
FIG. 11 is a schematic sectional view of a second form of a borehole logging tool cryostat.

The thermal screening effect of the tube 42 and 142 shown in FIGS. 2 and 3 can be further enhanced by interposing a second similar tube around the rods 46 and 146. Such a construction is shown in FIG. 11, in which a detector 422, housing 430, end cap 432, bellows 438 and 444, plate 440, tube 442 and rod 446 correspond to the parts having similar reference numerals, without the prefix 4, in FIG. 2. It can be seen that a third stainless steel bellows 449 depends from the plate 440 and carries a similar annular plate 451, to the periphery of which is secured the upper end of a tube 453 extending down between and spaced from the tube 442 and the rod 446. The second bellows 444, which carries the rod 446, depends in turn from the plate 451. The materials and dimensions of the tubes 442, 453 and the rod 446 are chosen in accordance with the criteria discussed earlier.

Although, as previously explained, the optimum configuration for cryostat 24 is that shown schematically is FIG. 2 with its detailed construction of FIGS. 3–10, other configurations are possible. With reference to FIG. 12, a cryostat 524 is shown to include detector 522, housing 530, end cap 532, bellows 538, plate 540, rod 546, boss 548, and foil 552 all of which correspond to the parts having similar reference numerals, without the prefix 5, in FIG. 2. In this embodiment as previously discussed, screening means 42 (FIG. 2) is replaced by a tube of insulation 542 wrapped around rod 546. The tube of insulation 542 is a metal-plastic laminate commonly referred to as "super-insulation." The mass of rod 546 is increased from that of rod 46 in FIG. 2, to increase its heat energy capacity and to compensate for the deletion of the heat energy capacity of tube 42. (FIG. 2). The lower end of rod 546 has a counterbore formed therein to define a chamber 550 to receive detector 522. Detector 522 may then be mounted to rod 546 in the same manner as the embodiment of FIG. 2 as shown in FIGS. 3a–3d and 7. Plate, or adaptor piece 540, may be supported within housing 530 in the same manner as adaptor piece 140 in FIGS. 3b, 5 and 6. The lower end of rod 546 may likewise be supported within housing 530 in the same manner as rod 146 is supported in FIGS. 2, 8, and 10, or in the manner in which the lower end of tube 142 is supported in FIGS. 2, 8, and 9.

A portion (not shown) of the tubular insulation 542 would be removed to allow communication between an active getter material (not shown) disposed within rod 546 and the annular space 556, between rod 546 and housing 530, in the manner described in connection with the embodiment of FIG. 3 as previously discussed. In order to maximize the heat energy capacity, the single phase heat sink, or rod 546, of solid thermally conductive material may be made of aluminum, an aluminum alloy, copper or magnesium.

It is to be understood that the invention is not limited to the exact details of construction, operation, or exact materials or embodiments shown and described as obvious modifications and equivalents will be apparent to one skilled in the art, and the invention is therefore to be limited only by the scope of the appended claims.

We claim:

1. A cryostat for a high-sensitivity photon detector and adapted for use in a borehole logging tool, comprising:
   an evacuable housing of generally tubular form;
   an elongate single-phase heat sink of solid, thermally conductive material disposed within said housing for thermal contact with a photon detector to be maintained at cryogenic temperatures; and
   means for establishing thermal contact between said heat sink and a cooling means separate from said cryostat, prior to use of the cryostat, whereby said detector is maintained at cryogenic temperatures by absorption and retention of heat within said heat sink.

2. The borehole logging tool cryostat of claim 1 wherein said heat sink is provided with a layer of insulation disposed about the periphery of said heat sink.

3. The borehole logging tool cryostat of claim 1 wherein the heat sink is made of copper.

4. The borehole logging tool cryostat of claim 1 wherein the heat sink is made of aluminum.

5. A borehole logging tool cryostat, comprising:
   a high-sensitivity photon detector;
   the cryostat, having the photon detector disposed therein, including:
   an evacuable housing of generally tubular form;
   an elongate single-phase heat sink of solid, thermally conductive material disposed within said housing for thermal contact with the photon detector to be maintained at cryogenic temperatures; and
   means for establishing thermal contact between said heat sink and a cooling means separate from said cryostat, prior to use of the cryostat, whereby said detector is maintained at cryogenic temperatures by absorption and retention of heat within said heat sink.

6. The borehole logging tool of claim 5 wherein said heat sink is provided with a layer of insulation disposed about the periphery of said heat sink.

7. The borehole logging tool of claim 5 wherein the heat sink is made of copper.

8. The borehole logging tool of claim 5 wherein the heat sink is made of aluminum.

* * * * *